United States Patent [19]
Defranould et al.

[11] 4,084,192
[45] Apr. 11, 1978

[54] ELECTRO-ACOUSTIC DEVICES FOR ANALYSING OPTICAL IMAGE

[75] Inventors: Philippe Defranould; Bernard Munier, both of Paris, France

[73] Assignee: Thomson-CSF, Paris, France

[21] Appl. No.: 721,569

[22] Filed: Sep. 8, 1976

[30] Foreign Application Priority Data

Sep. 11, 1975   France .................. 75 27926

[51] Int. Cl.[2] .................. H04N 3/14; H01L 27/14
[52] U.S. Cl. .................. 358/213; 250/211 J; 357/30
[58] Field of Search .......... 358/213; 357/30; 250/211 J, 211 R

[56] References Cited

U.S. PATENT DOCUMENTS

| 3,826,865 | 7/1974 | Quate et al. .................. 358/213 |
| 3,826,866 | 7/1974 | Quate et al. .................. 358/213 |
| 4,041,536 | 8/1970 | Melcher et al. .................. 358/213 |

OTHER PUBLICATIONS

Quate et al., "Scanning Optical Patterns with Acoustic Surface Waves," *Journal de Physique*, Colloque C6, Tome 33, Nov.–Dec. 1972, pp. 231–234.

*Primary Examiner*—John C. Martin
*Attorney, Agent, or Firm*—Roland Plottel

[57] ABSTRACT

A reading device for analysing an optical image in one dimension and for converting it into an electrical signal the amplitude of which characterizes the light intensity of the elemental zones analysed by a semiconductive substrate and scanned by the interaction of acoustic surface waves on a piezoelectric substrate, which comprises, for increasing its sensitivity, discrete junctions on the surface of the photosensitive semiconductive substrate "scanned" by the surface waves arising out of the non-linear interaction, and wherein the output signal is collected between an electrode disposed on the other surface of the semiconductive substrate and an electrode of the piezoelectric substrate.

8 Claims, 4 Drawing Figures

ELECTRO-ACOUSTIC DEVICES FOR ANALYSING OPTICAL IMAGE

This invention relates to an improved device for reading one-dimensional optical images which, for converting the differences in the light intensity of the image to be analysed into an electrical signal, uses a semiconductive and photoconductive substrate, which converts the optical image into an electrical image, and a piezoelectric substrate for acoustically scanning the electrical image thus present on the semiconductor.

Devices which use acoustic waves propagated at the surface of a piezoelectric substrate for reading an optical image projected onto a semiconductive substrate, which it renders conductive to a greater or lesser extent, depending upon its intensity, are now well known.

The sensitivity of such devices is an important parameter that it would be convenient to improve, because the higher the sensitivity of such a device, the better are converted into a suitable electrical output signal the poor luminous zones of an optical image and the slight differences in luminosity. This is of course essential for a good analysis of an optical image.

The present invention provides a new and original device which enables this sensitivity to be significantly increased whilst, at the same time, retaining a simple structure which is relatively easy to produce.

An electro-acoustic device according to the invention, for analysing a one-dimensional optical image comprises a photosensitive semiconductive substrate onto which said image is projected when operating; a piezoelectric substrate separated from said semiconductive substrate by a thin air gap, the opposite surfaces of the two said substrates being called "interaction surfaces" and defining an "interaction zone"; two transducers for converting high frequency electrical signals applied to them in operation, into acoustic surface waves and disposed respectively at each end of the interaction surface of the piezoelectric substrate; means for applying to each of said two transducers a high frequency signal such that the two resulting surface waves, propagated in opposite direction when operating, interact non-linearly in an elementary zone of the piezoelectric substrate which moves from one end to the other of its interaction surface, so as to obtain acoustic scanning of the interaction zone; said interaction surface of said semiconductive substrate comprising discrete junctions, each of which creating a depletion zone when operating, in the vicinity of said surface of the semiconductive substrate; and an output electrode disposed on that surface of the semiconductive substrate which is opposite said interaction surface, for collecting during said acoustic scanning an electrical signal which is the output signal of the electro-acoustic device.

Other objects and a fuller understanding of the invention may be had by referring to the following description taken in conjunction with the accompanying drawings, wherein.

Figure 1:
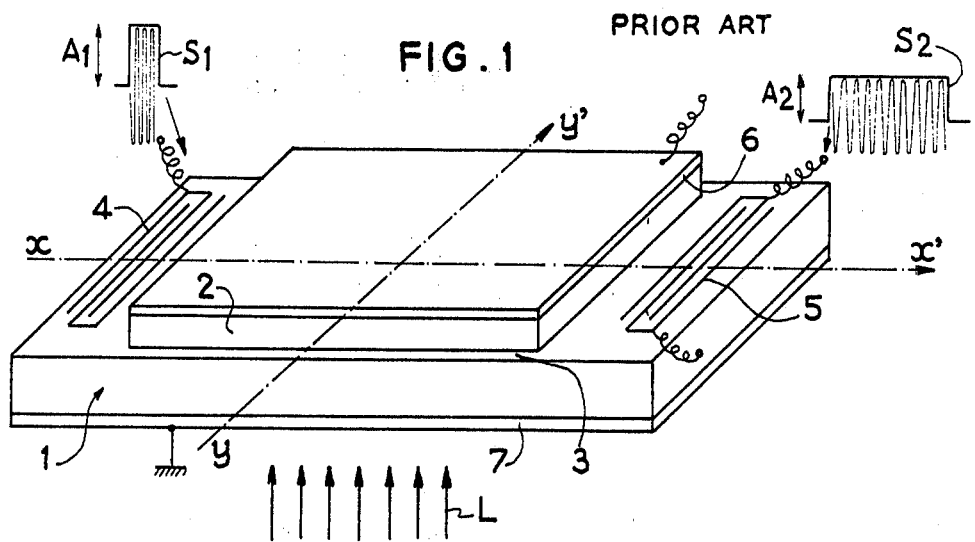
FIG. 1 is a diagrammatic perspective view of a prior art electro-acoustic reading device.

The essential components of a conventional reading device are diagrammatically illustrated in FIG. 1.

A piezoelectric substrate 1, capable of propagating surface waves, is disposed opposite a photosensitive semiconductive substrate 2 from which it is separated by a thin air gap 3. These two substrates are in the form of thin plates elongated in the direction $xx'$. The direction $xx'$ is the direction in which an optical image projected (arrows L) onto the semiconductive substrate will be scanned so that its various elemental zones situated along $xx'$ will thus be analysed.

In the example illustrated here, the optical image is projected onto the semiconductive substrate 2 through the substrate 1, as is frequently the case because, in general, the piezoelectric materials currently available are more transparent than semiconductive materials, for example silicon. Now, the useful surface of the semiconductive substrate 2 is that of its surfaces which is opposite the piezoelectric substrate 1. These two opposite surfaces are called "interaction surfaces" and between them define an "interaction zone". It is thus preferable to transmit the optical image to the interaction surface of the semiconductor through the most transparent material.

The optical image projected onto the semiconductor 2 modulates its conductivity in dependence upon the light intensity of its elemental zones, or image points, aligned along $xx'$.

The interaction surface of the piezoelectric substrate comprises two transducers 4 and 5 disposed respectively at each end so as to transmit acoustic surface waves propagated in opposite directions along $xx'$ when high frequency electrical signals, $S_1$ and $S_2$, respectively, are applied to them. These transducers are, for example, metallic interdigital combs.

Whereas the signal $S_2$ is a signal of frequency F, amplitude $A_2$ and long duration, the signal $S_1$ is a brief pulse of frequency F and amplitude $A_1 > A$. The duration of the signal $S_2$ is substantially equal to twice the propagation time of the surface waves between the two transducers.

The pulse $S_1$, called the scanning signal, is applied to the transducer 4 at an instant such that the surface waves corresponding to the signal $S_2$ have arrived at the transducer 4. Thus, when the brief train of waves transmitted by the transducer 4 is travelling towards transducer 5, it interacts with the waves corresponding to the signal $S_2$ sequentially along the entire length of the piezoelectric substrate.

This non-linear interaction which moves along $xx'$ with the wave generated by $S_1$ is translated by an interaction signal to which corresponds a potential which is developed across the interaction zone 3.

Since the two signals $S_1$ and $S_2$ have the same pulsation $\omega$, this interaction signal is conventionally a signal with a frequency of 2F and a wave number $k$ of zero. The electrical signal arising out of the interaction may then be collected at a continuous electrode 6 disposed on that surface of the semiconductive substrate 2 which is opposite its interaction surface. For example, it will be collected between this electrode 6 and an earth electrode, a transparent electrode 7 covering that surface of the piezoelectric substrate which is opposite its interaction surface.

Now, the interaction signal thus collected is proportional to the product of the amplitudes $A_1 A_2$. The proportionality factor K measures the effectiveness of the interaction and is determined by the conductivity of the elemental semiconductor zone affected by the interaction.

Thus, the amplitude of the output signal collected between the electrodes 6 and 7 varies with the light intensity of the analysed image. The amplitude of this signal is thus amplitude-modulated as the wave corresponding to the scanning pulse $S_1$ travels along $xx'$.

Figure 2:
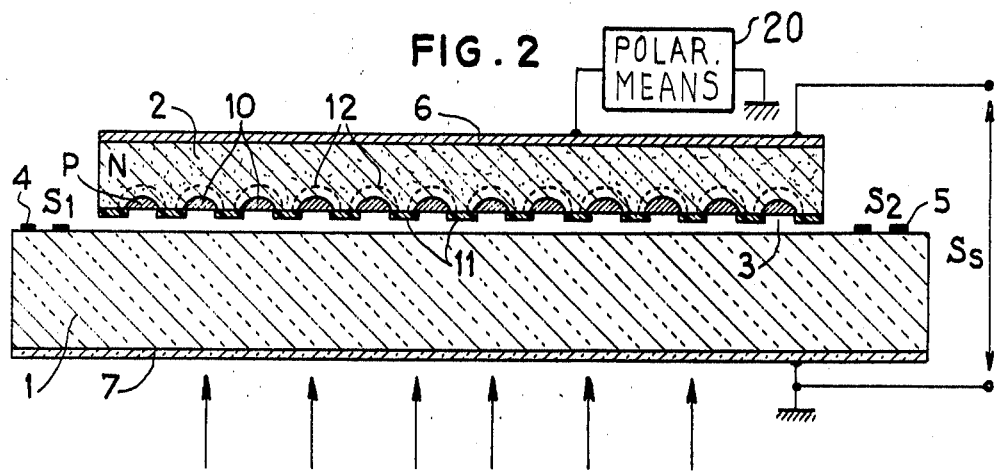
FIG. 2 is a diagrammatic section through an electro-acoustic reading device improved in accordance with the invention.

FIG. 2 is a diagrammatic section through one embodiment of a reading device according to the invention.

In this case, too, a piezoelectric substrate 1 and a photosensitive semiconductive substrate 2, for example of silicon, are separated by an interaction zone 3.

On its interaction surface, the piezoelectric substrate comprises a transducer 4 intended to receive a scanning signal $S_1$ and a transducer 5 intended to receive a longer signal $S_2$.

The output signal $S_s$ is extracted between the electrode 6 and the earth electrode 7.

In this case, however, the interaction surface of the semiconductive substrate 2 comprises in accordance with the invention a multitude of junctions, for example PN junctions. Since the substrate 2 consists for example of N type silicon, the junctions may be obtained by the diffusion (10) of P type impurities through an oxide mask 11. The oxide layer 11 shown in FIG. 2 is used solely for the production of diodes. It may either be left intact, since it does not interfere with the operation of the structure as a whole, or may be eliminated, for example by a chemical process. The junctions may even be obtained by ion implantation.

The presence of these junctions is reflected in the presence, in the vicinity of the interaction surface of the semiconductive substrate 2, of space charge zones 12, i.e. depletion zones cleared of majority carriers. These majority carriers, in this case electrons since the substrate is of N-type, are in effect repelled towards the opposite surface of the substrate in consistency with the well known effects of junctions.

By virtue of these discrete depletion zones the effects of the light incident upon the corresponding junctions, i.e. the creation of electron-hole pairs under the effect of the photonic energy, are more sensitive. In other words, the effectiveness of the interaction defined above, which is determined by the carrier density of the photosensitive semiconductive substrate, and which is greater, the lower this density, is locally increased around the junctions in the depletion zones 12 where a photovoltaic effect appears. This results in an increase in the sensitivity of the device to light.

It is also pointed out that, since this increase in sensitivity is local, the interaction is localised to the places where the junctions are situated. The elemental image zones are thus materially defined which enables images to be clearly restored, the information contained in one zone being in no danger of interfering with the information contained in an adjacent zone along the axis $xx'$.

It is clear that it is possible, depending upon the dimensions of the junctions, either to form one junction per image point, i.e. per elemental luminous zone, or to form several junctions per image point.

Figure 3:
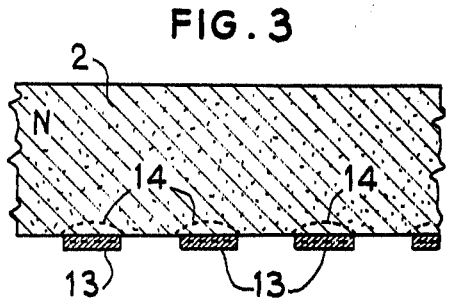
FIGS. 3 and 4 are sections through part of a reading device forming a variant of the invention.
Figure 4:
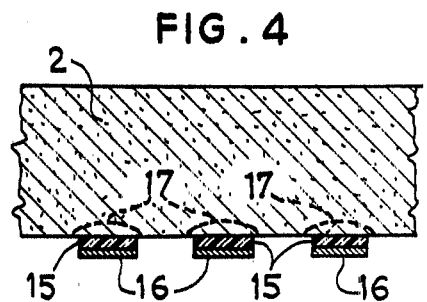

FIGS. 3 and 4 are diagrammatic sections through part of a photosensitive semiconductive substrate 2, for example N-type silicon, which may be used in a device according to the invention such as that illustrated in FIG. 2.

The PN-junction of FIG. 2 are replaced in FIG. 3 by Schottky junctions. A metallic electrode 13, arranged on the interaction surface of the substrate 2, forms a Schottky junction with that substrate. In this case, the depletion 14 is created by the passage of majority carriers from the substrate 2 into the metallic electrode 13. The mode of operation is identical with that of FIG. 2.

Finally, in FIG. 4, the junctions are formed by discrete MIS (metal-insulator-semiconductor) or MOS (metal-oxide-semiconductor) systems formed on the substrate 2. Oxide islets 15 are for example formed on the substrate 2 and are then covered by a metallic layer 16. Depletion zones 17 appear in the semiconductor 2 under the effect of the electrical charges applied by the insulator, in accordance with the processes well known in semiconductor technology. The presence of positive charges, for example at the oxide-semiconductor interface, repels the electrons of an N-type substrate 2.

In the variants described thus far, in which the signals $S_1$ and $S_2$ applied to the two transducers 4 and 5 of the reading device have the same frequency, the wave number $k$ of the waves produced by the non-linear interaction is zero. The interaction surface of the semiconductive substrate 2 forms a phase plane and the interaction signal may be extracted at any point of that plane. The junctions according to the invention, which in fact constitute the reading points of the interaction signal, may thus be disposed in any manner on that surface. They may be formed by bands perpendicular to the direction $xx'$ in which the waves are propagated on the piezoelectric substrate 1, these bands having any, optionally constant spacing. They may be formed by islets randomly distributed over the interaction surface of the semiconductive substrate 2.

By contrast, in a variant of the device according to the invention where the signals $S_1$ and $S_2$ respectively applied to the transducers 4 and 5 have different frequencies $F_1$ and $F_2$, the junctions according to the invention should no longer be disposed in an arbitrary manner because, in this case, the non-linear interaction gives rise to waves of frequency $F_1 + F_2$ and of wave number $k_1 - k_2$, and to waves of frequency $F_1 - F_2$ and of wave number $k_1 + k_2$, where $k_1 = (2\pi F_1)/v$ and $k_2 = (2\pi F_2)/v$ if $v$ is the propagation velocity of the waves on the piezoelectric substrate.

In order suitably to collect an interaction signal at the electrode 6, the junctions have to be regularly spaced along the axis $xx'$ at a constant interval $p$.

If it is desired to collect an interaction signal of frequency $F_1 - F_2$, the interval $p$ will be such that:

$$2\pi/p = k_1 + k_2$$

or even:

$$p = v/(F_1 + F_2)$$

If, on the other hand, it is desired to collect an interaction signal of frequency $F_1 + F_2$, the interval $p$ will be such that:

$$2\pi/p = k_1 - k_2$$

or even:

$$p = v/(F_1 - F_2)$$

The choice of one or other of these two reading signals will be determined by the more or less considerable technological facility of producing junctions spaced apart from one another at the two intervals $p$ which have just been calculated.

In either case, it can be of advantage to filter the selected reading signal so as to free it from parasites attributable to the non-selected signal.

It should also be pointed out that, irrespective of the method adopted for producing the junctions, their effect may be increased even further because, if these junctions are inversely polarised by an external polarisation source, the size of the depletion zones is increased.

Polarisation such as this may be directly applied during scanning to the semiconductive substrate by way of suitable electrodes, a pulse of suitable polarisation by polarisation means 20 being applied for example to the electrode 6 so as to make it positive (because in this case the semiconductor is of N-type) relative to the electrode 7, serving as potential reference, throughout the entire duration of the acoustic scanning. This polarisation may also be obtained by the scanning signal itself. It is sufficient to select it with an amplitude sufficient for it to create electro-acoustic currents inversely polarising the junctions on the interaction surface of the semiconductive substrate.

What is claimed is:

1. An electro-acoustic device for analysing a one-dimensional optical image, comprising:
    a photosensitive semiconductive substrate onto which said image is projected;
    a piezoelectric substrate separated from said semiconductive substrate by a thin air gap, the opposite surfaces of the two said substrates being called "interaction surfaces" and defining an "interaction zone";
    two transducers for converting high frequency electrical signals applied to them, into acoustic surface waves and disposed respectively at each end of the interaction surface of the piezoelectric substrate;
    means for applying to each of said two transducers a high frequency signal such that the two resulting surface waves, propagated in opposite directions, interact non-linearly in an elementary zone of the piezoelectric substrate which moves from one end to the other of its interaction surface, so as to obtain acoustic scanning of the interaction zone;
    said interaction surface of said semiconductive substrate comprising discrete junctions, each of which creating a depletion zone in the vicinity of said surface of the semiconductive substrate;
    and an output electrode disposed on that surface of the semiconductive substrate which is opposite said interaction surface, for collecting during said acoustic scanning an electrical signal which is the output signal of the electro-acoustic device.

2. A device as claimed in claim 1, wherein the electrical signals applied to the two said transducers have the same frequency F, said output signal is at the frequency 2F and the distribution and spacing of the junctions are arbitrary.

3. A device as claimed in claim 1, wherein the electrical signals ($S_1$, $S_2$) applied to the two said transducers have different frequencies $F_1$ and $F_2$, respectively, the junctions are regularly spaced along a direction parallel to the direction in which the acoustic waves are propagated on the piezoelectric substrate, the interval $p$ characterising this spacing being equal to $v/(F_1 + F_2)$ where $v$ is the propagation velocity of the acoustic surface waves on the piezeoelectric substrate, and the output signal is at the frequency $F_1 - F_2$.

4. A device as claimed in claim 1, wherein the electrical signals ($S_1$, $S_2$) applied to said transducers have different frequencies $F_1$ and $F_2$, respectively, the junctions are regularly spaced along a direction parallel to the direction in which the acoustic waves are propagated on the piezoelectric substrate, the interval $p$ characterising this spacing being equal to $v/(F_1 - F_2)$ where $v$ is the velocity of the acoustic surface waves on the piezoelectric substrate, and the output signal is at the frequency $F_1 + F_2$.

5. A device as claimed in claim 1, wherein said junctions are P-N junctions.

6. A device as claimed in claim 1, wherein said junctions are Schottky junctions.

7. A device as claimed in claim 1, wherein said junctions are metal-insulator-semiconductor (MIS) junctions.

8. A device as claimed in claim 1, further comprising additional external polarisation means for said discrete junctions, inversely polarising them so as to increase the dimensions of their depletion zones.

* * * * *